US011881381B2

(12) United States Patent
Kapoor et al.

(10) Patent No.: US 11,881,381 B2
(45) Date of Patent: Jan. 23, 2024

(54) CAPACITANCE MEASUREMENT WITHOUT DISCONNECTING FROM HIGH POWER CIRCUIT

(71) Applicant: Lam Research Corporation, Fremont, CA (US)

(72) Inventors: Sunil Kapoor, Vancouver, WA (US); Thomas Frederick, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 736 days.

(21) Appl. No.: 15/733,537

(22) PCT Filed: Feb. 22, 2019

(86) PCT No.: PCT/US2019/019279
§ 371 (c)(1),
(2) Date: Aug. 21, 2020

(87) PCT Pub. No.: WO2019/165297
PCT Pub. Date: Aug. 29, 2019

(65) Prior Publication Data
US 2021/0098233 A1  Apr. 1, 2021

Related U.S. Application Data

(60) Provisional application No. 62/634,730, filed on Feb. 23, 2018.

(51) Int. Cl.
*H01J 37/32* (2006.01)
*C23C 16/455* (2006.01)
(Continued)

(52) U.S. Cl.
CPC .. *H01J 37/32155* (2013.01); *C23C 16/45536* (2013.01); *C23C 16/505* (2013.01);
(Continued)

(58) Field of Classification Search
None
See application file for complete search history.

(56) References Cited

U.S. PATENT DOCUMENTS 7,042,311 B1   5/2006   Hilliker et al.
7,416,989 B1   8/2008   Liu et al.
(Continued)

FOREIGN PATENT DOCUMENTS

JP   H0927395 A       1/1997
JP   2001335944 A    12/2001
(Continued)

OTHER PUBLICATIONS

International Search Report and Written Opinion of the Searching Authority, dated Jun. 3, 2019, for International Patent Application No. PCT/US2019/019278.
(Continued)

*Primary Examiner* — Allan W. Olsen
(74) *Attorney, Agent, or Firm* — Weaver Austin Villeneuve & Sampson LLP

(57) ABSTRACT

A method and an apparatus of plasma-assisted semiconductor processing is provided. The method comprises: a) providing substrates at each of the multiple stations; b) distributing RF power including a first target frequency to multiple stations to thereby generate a plasma in the stations, wherein the RF power is distributed according to a RF power parameter configured to reduce station to station variations; c) tuning an impedance matching circuit for a first station included in the multiple stations while distributing RF power to the first station by: i) measuring a capacitance of a capacitor in the impedance matching circuit without disconnecting the capacitor from the impedance matching circuit; and ii) adjusting, according to the capacitance measured in (i) and the RF power parameter, a capacitance of the
(Continued)

capacitor; and d) performing a semiconductor processing operation on the substrate at each station.

20 Claims, 11 Drawing Sheets

(51) Int. Cl.

| | | |
|---|---|---|
| *C23C 16/505* | (2006.01) | |
| *C23C 16/52* | (2006.01) | |
| *G01R 13/02* | (2006.01) | |
| *G01R 19/00* | (2006.01) | |
| *G01R 27/26* | (2006.01) | |
| *H01L 21/67* | (2006.01) | |
| *G01N 21/95* | (2006.01) | |
| *H01L 23/64* | (2006.01) | |

(52) U.S. Cl.
CPC ......... *C23C 16/52* (2013.01); *G01N 21/9501* (2013.01); *G01R 13/02* (2013.01); *G01R 19/0084* (2013.01); *G01R 27/2605* (2013.01); *H01J 37/32091* (2013.01); *H01J 37/3299* (2013.01); *H01J 37/32183* (2013.01); *H01J 37/32899* (2013.01); *H01L 21/67253* (2013.01); *H01L 23/642* (2013.01); *H01J 2237/327* (2013.01); *H01L 21/67028* (2013.01); *H01L 21/67069* (2013.01); *H01L 2223/6655* (2013.01)

(56) References Cited

U.S. PATENT DOCUMENTS

| | | | |
|---|---|---|---|
| 7,977,249 | B1 | 7/2011 | Liu et al. |
| 7,981,763 | B1 | 7/2011 | van Schravendijk et al. |
| 8,058,179 | B1 | 11/2011 | Draeger et al. |
| 8,187,486 | B1 | 5/2012 | Liu et al. |
| 8,282,983 | B1* | 10/2012 | Kapoor ............ H01J 37/32174 118/712 |
| 9,263,350 | B2* | 2/2016 | Kapoor ............ H01J 37/32082 |
| 10,622,962 | B2* | 4/2020 | Kapoor ................ C23C 16/505 |
| 2010/0033194 | A1 | 2/2010 | Daniels et al. |
| 2011/0090613 | A1 | 4/2011 | Balasubramanian et al. |
| 2012/0074951 | A1 | 3/2012 | Chen et al. |
| 2015/0003306 | A1* | 1/2015 | Domino ................ H03H 11/28 333/103 |
| 2015/0348854 | A1* | 12/2015 | Kapoor ............ C23C 16/45536 438/10 |
| 2016/0168701 | A1 | 6/2016 | Kapoor et al. |
| 2016/0240356 | A1* | 8/2016 | Howald ............ H01J 37/32183 |
| 2017/0117869 | A1* | 4/2017 | Leeser ...................... H03H 7/38 |
| 2017/0140968 | A1 | 5/2017 | Sakiyama et al. |
| 2017/0338085 | A1 | 11/2017 | Sakiyama et al. |
| 2018/0062704 | A1* | 3/2018 | Singh ...................... H01Q 1/42 |
| 2020/0098546 | A1* | 3/2020 | Takahara ................. H03H 7/38 |
| 2020/0118856 | A1* | 4/2020 | Augustyniak ..... H01L 21/68771 |
| 2021/0090962 | A1 | 3/2021 | Kapoor et al. |
| 2023/0215696 | A1* | 7/2023 | Decker ............ H01L 21/31138 333/17.3 |

FOREIGN PATENT DOCUMENTS

| | | |
|---|---|---|
| JP | 2007-250755 | 9/2007 |
| JP | 2016-105489 | 6/2016 |
| JP | 2017224601 A | 12/2017 |
| KR | 10-2012-0098255 | 9/2012 |
| KR | 20150139461 A | 12/2015 |

OTHER PUBLICATIONS

International Search Report and Written Opinion of the Searching Authority, dated Jun. 5, 2019, for International Patent Application No. PCT/US2019/019279.
International Search Report and Written Opinion dated Jun. 3, 2019 issued in Application No. PCT/US2019/019278.
International Preliminary Report on Patentability dated Sep. 3, 2020 issued in Application No. PCT/US2019/019278.
CN Office Action dated Sep. 7, 2023, in Application No. CN201980015157.2 with English translation.
JP Office Action dated Jan. 10, 2023 in Application No. JP2020-0544419 with English translation.
JP Office Action dated Nov. 15, 2022 in Application No. JP2020-544396 with English translation.
KR Office Action dated Dec. 17, 2022, in Application No. KR10-2020-7027359.
KR Office Action dated Dec. 17, 2022, in Application No. KR10-2020-7027359 with English translation.
U.S Restriction requirement dated Aug. 9, 2023 in U.S. Appl. No. 15/733,536.

\* cited by examiner

CAPACITANCE MEASUREMENT WITHOUT DISCONNECTING FROM HIGH POWER CIRCUIT

CROSS-REFERENCE TO RELATED APPLICATIONS

This application is a national stage application under 35 U.S.C. § 371 of International Application PCT/US2019/019279 titled "CAPACITANCE MEASUREMENT WITHOUT DISCONNECTING FROM HIGH POWER CIRCUIT," filed on Feb. 22, 2019, which claims priority to and benefit of U.S. Ser. No. 62/634,730, filed on Feb. 23, 2018, and titled "CAPACITANCE MEASUREMENT WITHOUT DISCONNECTING FROM HIGH POWER CIRCUIT," which are both incorporated herein by reference in their entirety and for all purposes.

BACKGROUND

Semiconductor device fabrication involves the processing of semiconductor wafers in a semiconductor processing reactor. Typical processes involve deposition and removal (i.e., etching) of material on the wafer. In commercial scale manufacturing, each wafer contains many copies of a particular semiconductor device being manufactured, and many wafers are required to achieve the required volumes of devices. The commercial viability of a semiconductor processing operation depends in large part upon within-wafer uniformity and wafer-to-wafer repeatability of the process conditions. Accordingly, efforts are made to ensure that each portion of a given wafer and each wafer processed are exposed to the same processing conditions. Variation in the processing conditions can cause variation in deposition and etch rates resulting in unacceptable variation in the overall process and product

SUMMARY

A system of one or more computers can be configured to perform particular operations or actions by virtue of having software, firmware, hardware, or a combination of them installed on the system that in operation causes the system to perform the actions. One or more computer programs can be configured to perform particular operations or actions by virtue of including instructions that, when executed by data processing apparatus, cause the apparatus to perform the actions. One general aspect includes a method of plasma-assisted semiconductor processing in multiple stations in a process chamber, the method including: a) providing substrates at each of the multiple stations; b) distributing RF power including a first target frequency to multiple stations to thereby generate a plasma in the stations, where the RF power is distributed according to a RF power parameter configured to reduce station to station variations; c) tuning an impedance matching circuit for a first station included in the multiple stations while distributing RF power to the first station by: i) measuring a capacitance of a capacitor in the impedance matching circuit without disconnecting the capacitor from the impedance matching circuit; and ii) adjusting, according to the capacitance measured in (I) and the RF power parameter, a capacitance of the capacitor; and d) performing a semiconductor processing operation on the substrate at each station. Other embodiments of this aspect include corresponding computer systems, apparatus, and computer programs recorded on one or more computer storage devices, each configured to perform the actions of the methods.

Implementations may include one or more of the following features. The method where the semiconductor processing operation is one of: depositing, etching, stripping, or cleaning a thin film. The method where i) includes: aa) generating a first signal including a first frequency above the first target frequency in the RF power being distributed; bb) filtering a signal at the capacitor, the signal at the capacitor being generated in response to at least the first signal and the RF power being distributed; cc) measuring the filtered signal; and dd) converting the measured filtered signal to a measured capacitance value for the capacitor. The method where the filtering includes a passband centered at greater than a 10th harmonic frequency of the first target frequency, and the filtering includes a stopband including the first target frequency in the RF power being distributed. The method where the first target frequency in the RF power being distributed is about 13.56, 27, 40, 60, or 100 Mhz. The method where the first target frequency in the RF power being distributed is about 400 Khz. The method where: aa) includes generating an alternating voltage (Vin) as the first signal using a fixed frequency oscillator configured at the first frequency (w), an output of the fixed frequency oscillator being coupled to a resistance (R) that is in series with the capacitor; and dd) includes converting the measured filtered signal (Vout) to the measured capacitance value (c) based in part on the resistance (R), the first frequency (w), and the alternating voltage (Vin), where Vout/Vin=1/(1+jωRC). The method where: aa) includes generating an alternating voltage (Vin) as the first signal using a variable frequency oscillator, an output of the variable frequency oscillator being coupled to an inductance (l) that is in series with the capacitor, the variable frequency oscillator being configured to scan a frequency range including a resonant frequency (fo=ωO/2π) of the capacitor and the inductance; cc) includes using the measured filtered signal to determine the resonant frequency; and dd) includes converting the measured filtered signal to the measured capacitance value (c) based in part on the resonant frequency (fo=ωo/2π) and the inductance (l), where fo=ωo/2π=½π sqrt(lc). The method where: aa) includes generating an alternating voltage (Vin) as the first signal at the first frequency (w) using an oscillator, an output of the oscillator being coupled to a first terminal of the capacitor through at least a first impedance (z1) and a second impedance (z2) that are each in series with the capacitor, the output of the oscillator also being coupled to a second terminal of the capacitor through at least a third impedance (z3) that is in series with the capacitor; cc) includes measuring as the measured filtered signal a current or voltage at a node coupling the first impedance (z1), the second impedance (z2), and the third impedance (z3), where the measured filtered signal represents an imbalance between: a first impedance combination including the first impedance (z1) and the second impedance (z2), and a second impedance combination including the third impedance (z3) and an impedance of the capacitor (zC). The method may also include dd) includes converting the measured filtered signal to the measured capacitance value (c) based in part on a ratio z1/z2=z3/zC, where zC=1/jωc. The method where: aa) includes generating an alternating voltage (Vin) as the first signal at the first frequency (w) using an oscillator, an output of the oscillator being coupled to a reference capacitor (cref), and connecting the reference capacitor to be electrically parallel with the capacitor when the alternating voltage charges the reference capacitor to a reference voltage (vref); cc) includes measuring as the measured filtered signal a voltage corresponding to a charge in the electrically parallel combination of the reference capacitor and the capacitor at the first frequency (w); and dd) includes converting the measured filtered signal to the measured capacitance value (c) based in part on c=cref (vref/Vout−1). The method where: aa) includes generating an alternating current (Iin) as the first signal at the first frequency (w) at a first terminal of the capacitor using a current source, an output of the current source being coupled to a voltage measurement interface for measuring a voltage (V); cc) includes measuring as the measured filtered signal a filtered current (I) corresponding to a current at a second terminal of the capacitor; and dd) includes converting the measured filtered signal to the measured capacitance value (c) based in part on the filtered current (I) and a rate of change of the measured voltage at the voltage measurement interface (dv/dt), where i=c dv/dt. The method where: aa) includes generating a timer signal using a timer circuit where a timer frequency (f) is configured using a first resistance (r1), a second resistance (r2), and the capacitance (c) of the capacitor; cc) includes measuring as the measured filtered signal a timer pulse count within a time period for determining the timer frequency (f); and dd) includes converting the measured filtered signal to the measured capacitance value (c) based in part on the determined timer frequency, where f=1/(c×(r1+2×r2)×ln 2). The method where an oscilloscope is used to measure a voltage drop across the capacitor at the first frequency (ω). The method where an inductance (l), capacitance (c), and resistance (R) meter (LCR meter) is used to measure the capacitance of the capacitor at the first frequency (ω), or a vector network analyzer is used to measure an impedance of the capacitor at the first frequency (ω).

Implementations of the described techniques may include hardware, a method or process, or computer software on a computer-accessible medium. One general aspect includes an apparatus for plasma-assisted semiconductor processing, the apparatus including: multiple stations, where each of the stations includes at least one wafer support and is configured to receive at least one substrate, and where the multiple stations are within a process chamber; a capacitance sensor; one or more controllers, where the one or more controllers and the capacitance sensor are communicatively connected and the controller is configured to: a) provide substrates at each of the multiple stations; b) distribute RF power including a first target frequency to multiple stations to thereby generate a plasma in the stations, where the RF power is distributed according to a RF power parameter configured to reduce station to station variations; c) tune an impedance matching circuit for a first station included in the multiple stations while distribute RF power to the first station by: i) measure, using the capacitance sensor, a capacitance of a capacitor in the impedance matching circuit without disconnecting the capacitor from the impedance matching circuit; and ii) adjust, according to the capacitance measured in (I) and the RF power parameter, a capacitance of the capacitor; and d) performing a semiconductor processing operation on the substrate at each station. Other embodiments of this aspect include corresponding computer systems, apparatus, and computer programs recorded on one or more computer storage devices, each configured to perform the actions of the methods.

Implementations may include one or more of the following features. The apparatus where the semiconductor processing operation is one of: depositing, etching, stripping, or cleaning a thin film. The apparatus where i) includes: aa) generate a first signal including a first frequency above the first target frequency in the RF power being distributed; bb) filter a signal at the capacitor, the signal at the capacitor being generated in response to at least the first signal and the RF power being distributed; cc) measure the filtered signal; and dd) convert the measured filtered signal to a measured capacitance value for the capacitor. The apparatus where the filter includes a passband centered at greater than a 10th harmonic frequency of the first target frequency, and the filter includes a stopband including the first target frequency in the RF power being distributed. The apparatus where the first target frequency in the RF power being distributed is about 13.56, 27, 40, 60, or 100 Mhz. The apparatus where the first target frequency in the RF power being distributed is about 400 Khz. The apparatus where: aa) includes generate an alternating voltage (Vin) as the first signal using a fixed frequency oscillator configured at the first frequency (w), an output of the fixed frequency oscillator being coupled to a resistance (R) that is in series with the capacitor; and dd) includes convert the measured filtered signal (Vout) to the measured capacitance value (c) based in part on the resistance (R), the first frequency (ω), and the alternating voltage (Vin), where Vout/Vin=1/(1+jωRC). The apparatus where: aa) includes generate an alternating voltage (Vin) as the first signal using a variable frequency oscillator, an output of the variable frequency oscillator being coupled to an inductance (l) that is in series with the capacitor, the variable frequency oscillator being configured to scan a frequency range including a resonant frequency (fo=ωo/2π) of the capacitor and the inductance; cc) includes using the measured filtered signal to determine the resonant frequency; and dd) includes convert the measured filtered signal to the measured capacitance value (c) based in part on the resonant frequency (fo=ωo/2π) and the inductance (l), where fo=ωo/2π=½π sqrt(lc). The apparatus where: aa) includes generate an alternating voltage (Vin) as the first signal at the first frequency (w) using an oscillator, an output of the oscillator being coupled to a first terminal of the capacitor through at least a first impedance (z1) and a second impedance (z2) that are each in series with the capacitor, the output of the oscillator also being coupled to a second terminal of the capacitor through at least a third impedance (z3) that is in series with the capacitor; cc) includes measure as the measured filtered signal a current or voltage at a node coupling the first impedance (z1), the second impedance (z2), and the third impedance (z3), where the measured filtered signal represents an imbalance between: a first impedance combination including the first impedance (z1) and the second impedance (z2), and a second impedance combination including the third impedance (z3) and an impedance of the capacitor (zC). The apparatus may also include dd) includes convert the measured filtered signal to the measured capacitance value (c) based in part on a ratio z1/z2=z3/zC, where zC=1/jωc. The apparatus where: aa) includes generate an alternating voltage (Vin) as the first signal at the first frequency (w) using an oscillator, an output of the oscillator being coupled to a reference capacitor (cref), and connecting the reference capacitor to be electrically parallel with the capacitor when the alternating voltage charges the reference capacitor to a reference voltage (vref); cc) includes measure as the measured filtered signal a voltage corresponding to a charge in the electrically parallel combination of the reference capacitor and the capacitor at the first frequency (w); and dd) includes convert the measured filtered signal to the measured capacitance value (c) based in part on c=cref (vref/Vout−1). The apparatus where: aa) includes generate an alternating current (Iin) as the first signal at the first frequency (w) at a first terminal of the capacitor using a current source, an output of the current source being coupled to a voltage measurement interface for measure a voltage (V); cc) includes measure as the measured filtered signal a filtered current (I) corresponding to a current at a second terminal of the capacitor; and dd) includes convert the measured filtered signal to the measured capacitance value (c) based in part on the filtered current (I) and a rate of change of the measured voltage at the voltage measurement interface (dv/dt), where i=c dv/dt. The apparatus where: aa) includes generate a timer signal using a timer circuit where a timer frequency (f) is configured using a first resistance (r1), a second resistance (r2), and the capacitance (c) of the capacitor; cc) includes measure as the measured filtered signal a timer pulse count within a time period for determining the timer frequency (f); and dd) includes convert the measured filtered signal to the measured capacitance value (c) based in part on the determined timer frequency, where $f=1/(c\times(r1+2\times r2)\times \ln 2)$. The apparatus where an oscilloscope is used to measure a voltage drop across the capacitor at the first frequency (w). The apparatus where an inductance (l), capacitance (c), and resistance (R) meter (LCR meter) is used to measure the capacitance of the capacitor at the first frequency (w), or a vector network analyzer is used to measure an impedance of the capacitor at the first frequency ($\omega$).

Implementations of the described techniques may include hardware, a method or process, or computer software on a computer-accessible medium. One general aspect includes a device for measuring a capacitance of a capacitor without disconnecting the capacitor from a circuit for distributing RF power at a first target frequency, the device including: a filter including a passband including a first frequency greater than a 10th harmonic frequency of the first target frequency, the filter also having a stopband including the first target frequency; an oscillator for generating an alternating voltage (Vin) at the first frequency ($\omega$); a resistance (R), where an output of the oscillator is coupled to a first terminal of the resistance (R), and a second terminal of the resistance (R) is coupled to the filter that is electrically coupled in series with the capacitor; and a voltage measurement interface for measuring a filtered signal (Vout) at the second terminal of the resistance (R), where a measured capacitance value (c) of the capacitor is based in part on the resistance (R), the first frequency ($\omega$), and the alternating voltage (Vin), where $Vout/Vin=1/(1+j\omega RC)$. Other embodiments of this aspect include corresponding computer systems, apparatus, and computer programs recorded on one or more computer storage devices, each configured to perform the actions of the methods.

Implementations may include one or more of the following features. The device where the first target frequency in the RF power being distributed is about 13.56, 27, 40, 60, or 100 Mhz. The device where the first target frequency in the RF power being distributed is about 400 Khz.

Implementations of the described techniques may include hardware, a method or process, or computer software on a computer-accessible medium.

DETAILED DESCRIPTION

In the following detailed description, numerous specific implementations are set forth. However, as will be apparent to those skilled in the art, the techniques and apparatus disclosed herein may be practiced without these specific details or by using alternate elements or processes. In other instances, well-known processes, procedures and components have not been described in detail so as not to unnecessarily obscure aspects of the present disclosure.

Certain semiconductor device fabrication tools include two variable capacitors, such as a series capacitor (Tune) and shunt capacitor (Load), that match the load impedance to generator impedance at, for example, a value of 50 ohms. Since one value of each capacitor results in a match of the load impedance to the generator impedance, it is important to monitor capacitor values. Existing technology uses, for example, stepper motors. Because stepper motors can involve issues with slipping couplers, such technology can result in the wrong position, and therefore an incorrect capacitor value which can cause scrapping of semiconductor wafers. Furthermore, conventional capacitance measuring methods require the capacitor being measured to be disconnected from the electrical circuit, such as the high power RF circuit involved in semiconductor fabrication. A technique for accurately measuring capacitance for monitoring and control, without disconnecting the capacitor during use, is needed.

Apparatus and methods are provided to control RF power used in multi-cycle deposition operations in a semiconductor tool with multiple processing stations that share an RF power source. The frequency of the RF power and the power applied to individual stations that share an RF power source are controlled.

Figure 1:
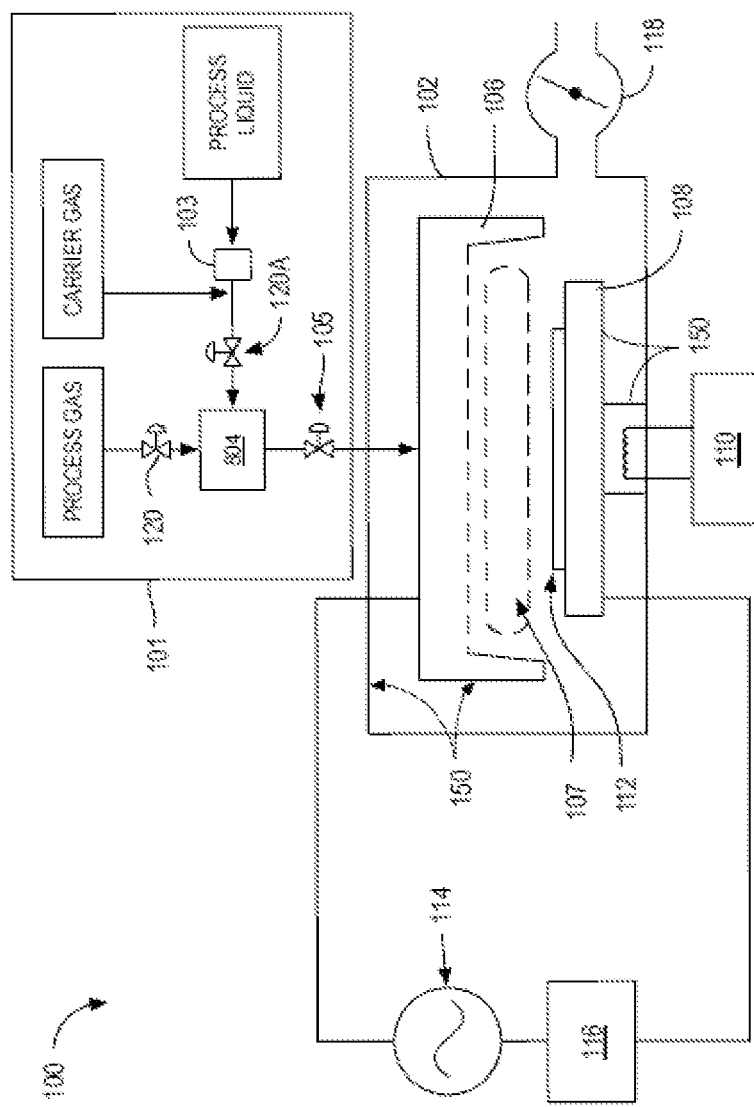
FIG. 1 shows a substrate processing apparatus for depositing films on semiconductor substrates.

FIG. 1 shows a substrate processing apparatus for depositing films on semiconductor substrates. The apparatus 100 of FIG. 1 has a single processing chamber 102 with a single substrate holder 108 in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1. The apparatus schematically illustrated in FIG. 1 provides the basic equipment for performing film deposition operations such as chemical vapor deposition (CVD) or ALD on semiconductor substrates.

Figure 2:
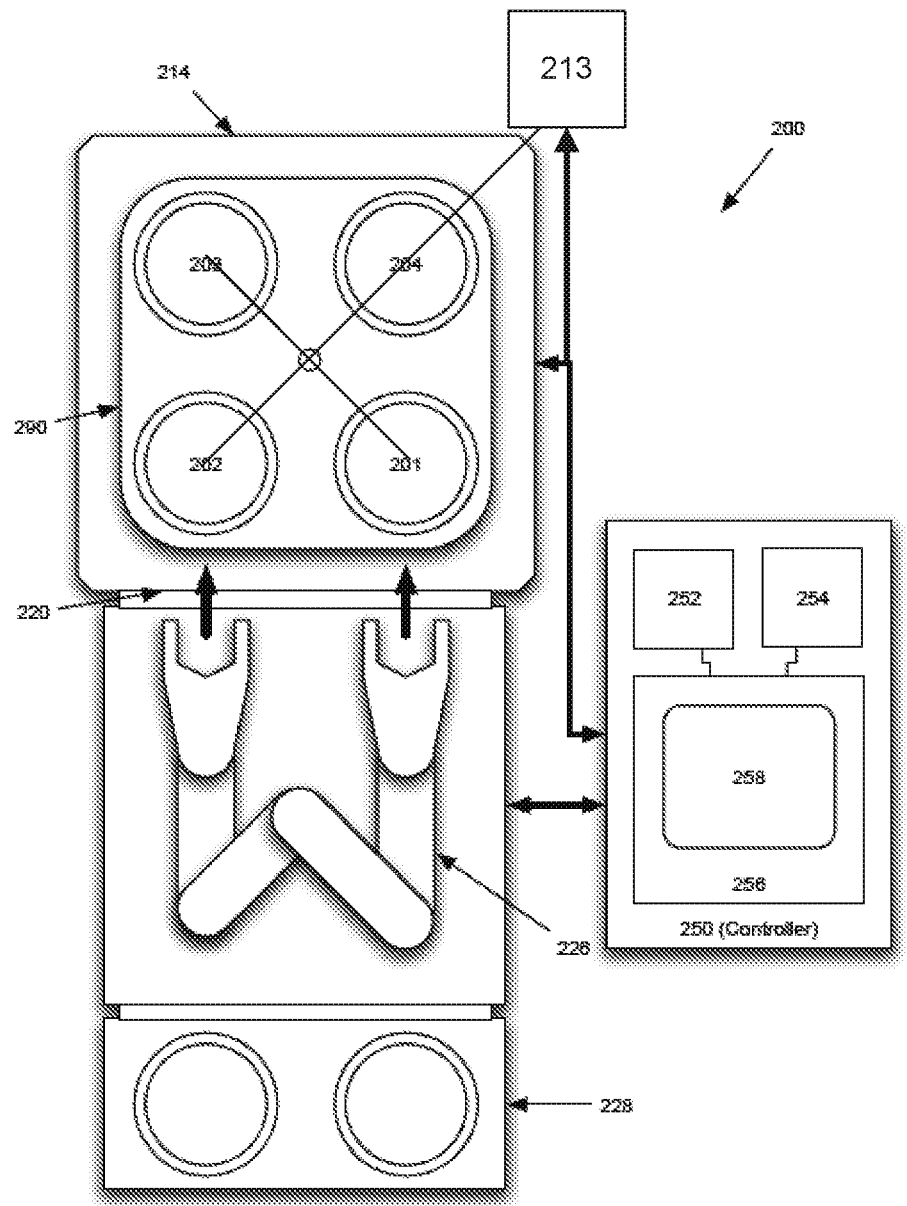
FIG. 2 shows an example multi-station substrate processing apparatus that may utilize plasma balancing hardware.

For simplicity, processing apparatus 100 is depicted as a standalone process station having a process chamber body 102 for maintaining a low-pressure environment. However, it will be appreciated that a plurality of process stations may be included in a common process tool environment—e.g., within a common reaction chamber—as described herein. For example, FIG. 2 depicts an implementation of a multi-station processing tool. Further, it will be appreciated that, in some implementations, one or more hardware parameters of processing apparatus 100, including those discussed in detail above, may be adjusted programmatically by one or more system controllers.

Process station 100 fluidly communicates with reactant delivery system 101 for delivering process gases to a distribution showerhead 106. Reactant delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to the process chamber 102. The implementation of FIG. 1 includes a vaporization point 103 for vaporizing liquid reactant to be supplied to mixing vessel 104. In some implementations, vaporization point 103 may be a heated liquid injection module. In some other implementations, vaporization point 103 may be a heated vaporizer. In yet other implementations, vaporization point 103 may be eliminated from the process station.

In some implementations, a liquid flow controller (LFC) upstream of vaporization point 103 may be provided for controlling a mass flow of liquid for vaporization and delivery to processing chamber 102.

Showerhead 106 distributes process gases and/or reactants (e.g., film precursors) toward substrate 112 at the process station, the flow of which is controlled by one or more valves upstream from the showerhead (e.g., valves 120, 120A, 105). In the implementation shown in FIG. 1, substrate 112 is located beneath showerhead 106, and is shown resting on a pedestal 108. Showerhead 106 may have any suitable shape, and may have any suitable number and arrangement of ports for distributing processes gases to substrate 112.

A volume 107 is located beneath showerhead 106. In some implementations, pedestal 108 may be raised or lowered to expose substrate 112 to volume 107 and/or to vary a volume of volume 107. Optionally, pedestal 108 may be lowered and/or raised during portions the deposition process to modulate process pressure, reactant concentration, etc. within volume 107.

In FIG. 1, showerhead 106 and pedestal 108 are electrically connected to RF power supply 114 and matching network 116 for powering a plasma. In some implementations, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Likewise, RF power supply 114 may provide RF power of any suitable frequency.

In some implementations, the plasma may be monitored in-situ by one or more plasma monitors. In one scenario, plasma power may be monitored by one or more capacitance, voltage and/or current sensors (e.g., load sensors such as VI probes). Examples of such sensors include MKS VI-Probe-4100 and 350. Such sensors may measure the capacitance, voltage, current, and phase differences. In certain implementations, the sensors may be electrically connected to the RF power supply and may be located at or near the showerhead. In such implementations, the impedance, as seen by the RF power supply may be representative of the impedance of the plasma. In another scenario, plasma density and/or process gas concentration may be measured by one or more optical emission spectroscopy (OES) sensors. In some implementations, one or more plasma parameters may be programmatically adjusted based on measurements from such in-situ plasma monitors. For example, a load sensor may be used in a feedback loop for providing programmatic control of plasma power. It will be appreciated that, in some implementations, other monitors may be used to monitor the plasma and other process characteristics. Such monitors may include, but are not limited to, infrared (IR) monitors, acoustic monitors, and pressure transducers.

In some implementations, the plasma may be controlled via input/output control (IOC) sequencing instructions. In one example, the instructions for setting plasma conditions for plasma activation may be included in a corresponding plasma activation recipe of a process recipe. In some cases, process recipes may be sequentially arranged, so that all instructions for a process are executed concurrently with that process. In some implementations, instructions for setting one or more plasma parameters may be included in a recipe preceding a plasma process. For example, a first recipe may include instructions for setting a flow rate of an inert (e.g., helium) and/or a reactant gas, instructions for setting a plasma generator to a power set point, and time delay instructions for the first recipe. A second, subsequent recipe may include instructions for enabling the plasma generator and time delay instructions for the second recipe. A third recipe may include instructions for disabling the plasma generator and time delay instructions for the third recipe. It will be appreciated that these recipes may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of less than 50 milliseconds, with 25 milliseconds being a specific example. Such short RF plasma strikes require quick stabilization and tuning of the plasma. To accomplish the quick stabilization and tuning of the plasma, the plasma generator may be configured through a two-step tuning process that includes a coarse tuning component and a fine tuning component. In the coarse tuning component, the impedance match may be preset to a particular impedance. The coarse tuning component may be preset such that a magnitude of the impedance is at a value of, for example, 50 ohms. In certain implementations, the coarse tuning component may be limited to adjustments affecting the magnitude of the impedance. In the fine tuning component, the RF frequency may be allowed to float from a baseline frequency in order to attempt to match the phase to a target value, such as a phase value of zero. Conventionally, high-frequency plasmas are generated at an RF frequency of about 13.56, 27, 40, 60, or 100 MHz. In various implementations disclosed herein, the frequency may be allowed to float to a value that is different from this standard value in order to match the phase to the target value. In certain implementations, the fine tuning component may be limited to adjustments affecting the phase of the impedance. By permitting the frequency to float while fixing the impedance match to a predetermined impedance, the plasma match can stabilize much more quickly. Very short plasma strikes, such as strikes associated with ALD or atomic layer etching (ALE) cycles, may benefit from quick stabilization of the plasma.

The first 1-2 milliseconds of a typical deposition cycle involve the ignition of the plasma. After ignition of the plasma, the fine tuning of the RF frequency is then carried out to match the plasma phase to the target value.

As described above, one or more process stations may be included in a multi-station substrate processing tool. FIG. 2 shows an example multi-station substrate processing apparatus that may utilize plasma balancing hardware. Various efficiencies may be achieved through the use of a multi-station processing apparatus like that shown in FIG. 2 with respect to both equipment cost and operational expenses. For instance, a single vacuum pump may be used to create a single high-vacuum environment for all four process stations by evacuating spent process gases, etc. for all four process stations. Depending on the implementation, each process station may have its own dedicated showerhead for gas delivery, but may share the same gas delivery system. Likewise, certain elements of the plasma generator equipment may be shared amongst process stations (e.g., power supplies), although depending on the implementation, certain aspects may be process station-specific (for example, if showerheads are used to apply plasma-generating electrical potentials). Once again, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

The substrate processing apparatus 200 of FIG. 2 employs a single substrate processing chamber 214 that contains multiple substrate process stations, each of which may be used to perform processing operations on a substrate held in a wafer holder at that process station. In this particular implementation, the multi-station substrate processing apparatus 200 is shown having four process stations 201, 202, 203, and 204. Other similar multi-station processing apparatuses may have more or fewer processing stations depending on the implementation and, for instance, the desired level of parallel wafer processing, size/space constraints, cost constraints, etc. Also shown in FIG. 2 are a substrate handler robot 226 and a controller 250.

As shown in FIG. 2, the multi-station processing tool 200 has a substrate loading port 220, and a robot 226 configured to move substrates from a cassette loaded through a pod 228 through atmospheric port 220, into the processing chamber 214, and onto one of the four stations 201, 202, 203, or 204.

The depicted processing chamber 214 shown in FIG. 2 provides four process stations, 201, 202, 203, and 204. The RF power is generated at an RF power system 213 and distributed to each of the stations 201-04. The RF power system may include one or more RF power sources, e.g., a high frequency (HFRF) and a low frequency (LFRF) source, impedance matching modules, and filters. In certain implementation, the power source may be limited to only the high frequency or low frequency source. Unless otherwise stated, assume that the described deposition processes employ only high frequency power. The distribution system of the RF power system is symmetric about the reactor and has high impedance. This symmetry and impedance result in approximately equal amounts of power being delivered to each station. Small differences in RF power, in the order of 5 to 15%, may arise from tolerances in distribution system components, station alignments, temperature differences, and process conditions.

Small differences in RF power, due to reasons including but not limited to inaccurate tuning of variable capacitors in an impedance matching module, or inaccurate measurements of current from a RF power source, can cause wafer-to-wafer non-uniformity in a variety of film characteristics, e.g., composition, thickness, density, amount of cross-linking, chemistry, reaction completion, stress, refractive index, dielectric constant, hardness, etch selectivity, stability, hermeticity, etc. The ability to fine-tune plasma power at individual stations and to dynamically respond to changing station conditions may decrease wafer-to-wafer non-uniformity. Note that the present method and apparatus are not limited to a multi-station reactor; the method and apparatus disclosed herein applies to other RF power systems where multiple processing areas share an RF power source.

FIG. 2 also depicts an implementation of a substrate transferring device 290 for transferring substrates between process stations 201, 202, 203, and 204 within processing chamber 214. It will be appreciated that any suitable substrate transferring device may be employed. Non-limiting examples include wafer carousels and wafer handling robots.

FIG. 2 also depicts an implementation of a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some implementations, system controller 250 controls some or all of the operations of process tool 200 including the operations of its individual process stations. System controller 250 may execute machine-readable system control instructions 258 on processor 252—the system control instructions 258, in some implementations, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components. System control instructions 258 may be coded in any suitable computer readable programming language. In some implementations, system control instructions 258 are implemented in software, in other implementations, the instructions may be implemented in hardware—for example, hard-coded as logic in an ASIC (application specific integrated circuit), or, in other implementations, implemented as a combination of software and hardware.

In some implementations, system control software 258 may include input/output control (IOC) sequencing instructions for controlling the various parameters described above. For example, each step of a deposition process or processes may include one or more instructions for execution by system controller 250. The instructions for setting process conditions for a primary film deposition process, for example, may be included in a corresponding deposition recipe, and likewise for a capping film deposition. In some implementations, the recipes may be sequentially arranged, so that all instructions for a process are executed concurrently with that process.

Other computer-readable instructions and/or programs stored on mass storage device 254 and/or memory device 256 associated with system controller 250 may be employed in some implementations. Examples of programs or sections of programs include a substrate positioning program, a process gas control program, a pressure control program, a heater control program, and a plasma control program.

In some implementations, there may be a user interface associated with system controller 250. The user interface may include a display screen, graphical software displays of the apparatus and/or process conditions, and user input devices such as pointing devices, keyboards, touch screens, microphones, etc.

In some implementations, parameters adjusted by system controller 250 may relate to process conditions. Non-limiting examples include process gas compositions and flow rates, temperatures, pressures, plasma conditions (such as RF bias power levels, frequencies, and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, load sensors, OES sensors, etc. Appropriately programmed feedback and control algorithms may be used with data from these sensors to maintain process conditions.

System controller 250 may provide machine-readable instructions for implementing deposition processes. The instructions may control a variety of process parameters, such as DC power level, RF bias power level, station-to-station variations such as RF power parameter (voltage, current, capacitance, impedance, phase, load power, etc.) variations, frequency tuning parameters, pressure, temperature, etc. The instructions may control the parameters, such as but not limited to controlling the variable capacitance in an impedance matching module, or controlling a current source based on measuring the current delivered from a RF power source to a plasma, to operate in-situ deposition of film stacks according to various implementations described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

Various other configurations for multi-cycle deposition processes and multi-station semiconductor processing apparatuses are described in U.S. Provisional Patent Application No. 61/994,025, filed May 15, 2014, and are hereby incorporated by reference.

Figure 3:
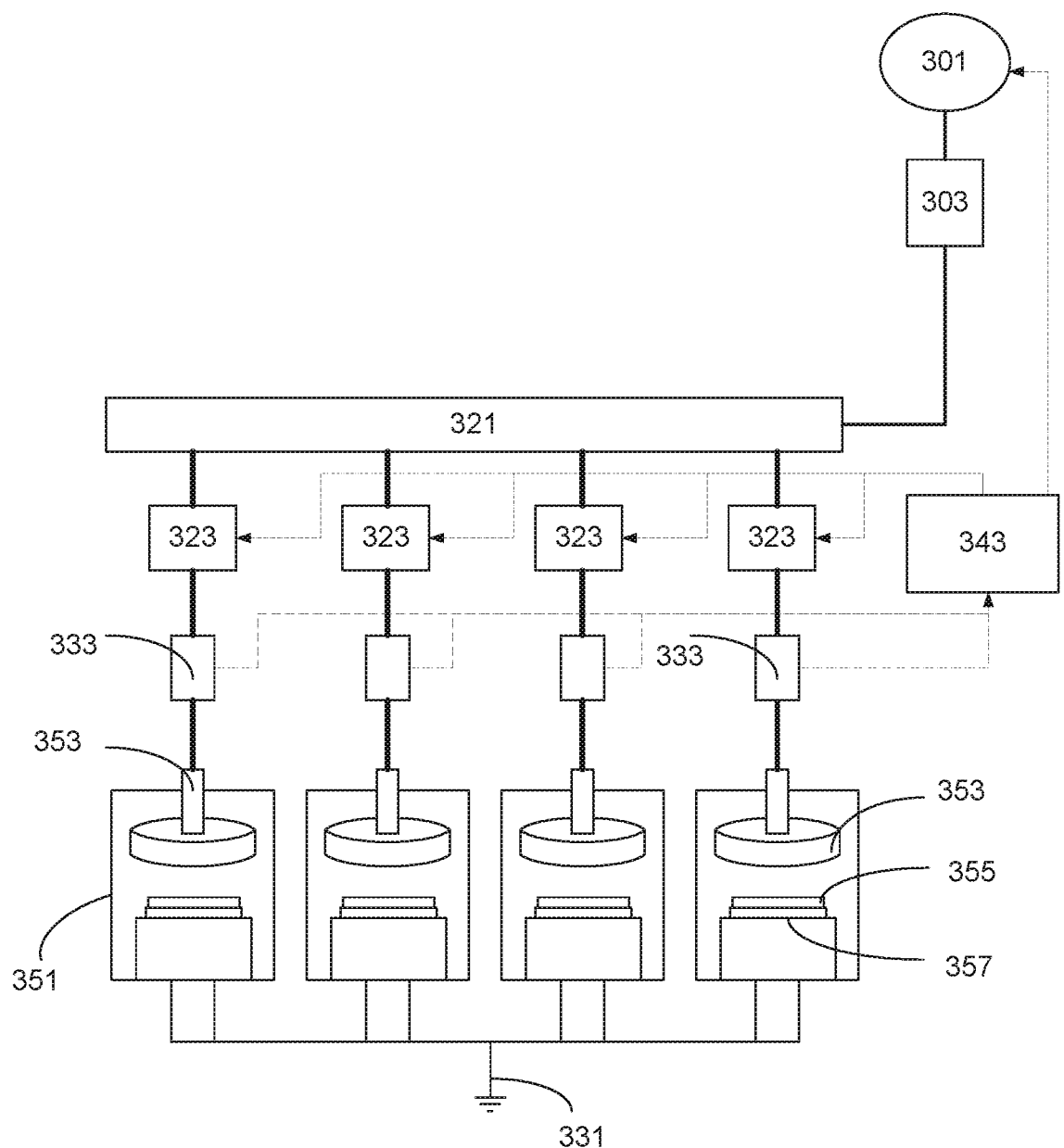
FIG. 3 is a schematic diagram showing various components in an example multi-station plasma reactor with multiple stations sharing a RF power source utilizing impedance matching tuning.

FIG. 3 is a schematic diagram showing various components in an example multi-station plasma reactor with multiple stations sharing a RF power source utilizing RF frequency tuning. As shown, a RF power source 301, which may be a high frequency RF power source, is distributed via a distribution network 321 to multiple stations 351. The HFRF may have a target frequency of about 2-60 MHz, or about 13.56 MHz. In other implementations, a low frequency RF power source may be used in addition to or in place of the high frequency RF power source. The low frequency RF power source may have a target frequency of about 100 kHz to about 1 MHz, or about 400 kHz. Certain commercially available RF power sources include the ability to tune the frequency of the RF power. Examples of such RF power sources include Advanced Engineer's Paramount series, MKS's SurePower series, Comdel's CB, CLX, and CDX series, and Huettinger's TruPlasma series.

The power from the RF power source 301 may be routed through an impedance matching system that may include a fixed match module 303. In certain implementations that contain both the high and the low frequency RF power source, a high pass filter and/or a low pass filter may also be present. Additionally, in certain implementations, the power from the RF power source may be routed through an auto match module (e.g., an impedance matching circuit with one or more tunable/variable/banked capacitors, etc.). Implementations that include the low frequency RF power source, whether in addition to or in place of the high frequency RF power source, low frequency power may be routed through either a fixed or auto match. In certain implementations, an auto match module may be used to match the RF power source impedance and the impedance of a load of the plasma (e.g., 50 ohms). In other implementations, a fixed match module, which does not automatically match the RF power source impedance to an impedance of a load of the plasma, may be used.

In the implementation shown in FIG. 3, the RF power source 301 is connected to the distribution network 321. The distribution network 321 may distribute the RF power generated by the RF power source 301 to each of the multiple stations 351. In certain implementations, the RF power distributed to a particular station is in the range including but not limited to 1.5-10 kW. The distribution network 321 is connected to a RF adjuster 323 for each of the multiple stations 351. For each of the multiple stations 351, the RF adjuster 323 is connected to a power parameter sensor 333 before the showerhead 353. The power parameter sensor 333 may be a sensor of any type previously disclosed, such as a voltage, current, capacitance, impedance, phase, or load power or an OES sensor. The RF power source 301 may obtain instructions from the RF controller 343 and vary the frequency of the RF power distributed to the stations. The instructions may be a frequency adjustment according to the voltage, current, capacitance, impedance, phase, or load power as detected by the one or more power parameter sensors 333. In other implementations, an additional sensor may measure a final phase that is representative of the phase of the plasmas in all of the stations 351. The RF controller 343 may then vary the frequency of the RF power distributed to the station according to the final phase measured by the additional sensor. In certain implementations, the RF controller 343 may include instructions, e.g., code, to vary the frequency of the RF power such that the phase of the impedance is zero or near zero. In the implementation shown in FIG. 3, the RF controller 343 may vary the frequency of the RF power from the RF power source 301 upstream of the individual stations.

The RF adjuster 323 is controlled by RF controller 343. RF controller 343 may change the RF power at individual stations by a determined amount based on the measurement from the sensors 333 at each station 351. In certain implementations, the RF adjusters 323 may be variable capacitors. The RF controller 343 may control a stepper motor (not shown) that can vary the capacitance of a variable capacitor. Other ways to vary a capacitance may be used. For example, the RF adjusters 323 may also be a bank of capacitors with individual switches. The RF power may be controlled by activating (turning on) a number of capacitors having a specified value. For example, capacitors may be selected to add 1 pF, 2 pF, 4 pF, 8 pF, and 16 pF shunt capacitance to the station. In this example, all combinations of active (turned on) and non-active (turned off) capacitors cover the range from 0 pF to 31 pF with 1 pF resolution. By selecting which capacitors to activate, the controller can change the RF power to a station. This digital control can be faster than using a stepper motor to control a variable capacitor, especially when a wide range of capacitance needs to be covered. Depending on the space available and the amount of control required, one skilled in the art would be able to design a RF adjuster using one or more capacitors to change RF power by a certain amount.

In other implementations, the RF adjusters 323 may be variable coil inductors. The RF controller 343 may control the variable coil inductors to affect RF power delivered to the station. In certain implementations, the RF adjusters are not limited to capacitor and inductors. In certain implementations, other RF adjusters 323 may utilize different mechanisms to change the RF power, such as resonator circuits or resistive circuits.

The sensors 333 measure at least one RF power parameter. The RF power parameter measured may be voltage, current, capacitance, impedance, phase, or load power. Commercially available probes may be used to measure the RF power parameter and provide the measurement to the RF controller 343. It is also possible to measure a non-RF parameter and use it as source signal for the RF controller 343. For example, optical emission from station plasma or substrate temperature sensors can measure station characteristics and feed them to the adjuster controller 343. An optical emission system may be installed in the vicinity of each station to collect light emitted by station plasma. A substrate temperature sensor may use remote infrared detection system built under a substrate. The sensor 333 may also measure multiple RF power parameters, or multiple sensors may be used in certain implementations to measure multiple RF power parameters.

In some implementations, the RF adjusters may be set to a fixed value or range of values over multi-step processes such as a multi-cycle ALD process. In such implementations, there is little or no need for real-time sensing of the RF power parameter(s) and adjustment of the station-to-station distribution of RF power.

In some implementations, the RF adjusters 323 are used for auto-matching the generator impedance of the RF power source 301 and the load impedance of the plasma. For example, the RF adjusters 323 can include two variable capacitors. The first variable capacitor can be a series (Tune) capacitor, and the second variable capacitor can be a shunt (Load) capacitor. The two variable capacitors can be adjusted such that the load impedance of the plasma is matched to a generator impedance of the RF power source 301 (e.g., 50 ohms).

In certain implementations, there is a particular capacitance value for each variable capacitor in the RF adjusters 323 that results in an impedance match. In various implementations, the RF controller 343 communicates with sensor 333 to obtain measurements of the capacitance values of the variable capacitors in the RF adjusters 323, and the RF controller 343 communicates with the RF adjusters 323 to control the variable capacitors in the RF adjusters 323 to achieve the particular capacitance value that results in an impedance match.

In various implementations, the sensor 333 can measure capacitance using a wide variety of techniques. Examples of capacitance measurement techniques include but are not limited to a voltage measurement method, resonant frequency method, a wheatstone bridge method, a charge based method, a ramp rate method, a timer method, an oscilloscope method, a LCR meter method, or a vector analyzer method, and so forth, as described in further detail below.

In a class of implementations, the sensor 333 measures capacitances of the variable capacitors in the RF adjusters 323 without requiring that the variable capacitors be disconnected from the RF power source 301, such as by disconnecting from the distribution network 321 or the fixed match module 303. In certain implementations, the sensor 333 also measures capacitances of the variable capacitors in the RF adjusters 323 while the RF power source 301 is generating a high power RF output.

In various implementations, the sensor 333 includes a frequency generator, a filter, an interface for coupling to a capacitor included in a main circuit, and an interface for coupling to a device for measuring a parameter, the parameter including at least one of a current, voltage, impedance, resonance, capacitance, charge, or pulse count, the filter having a passband including a first frequency signal generated by the frequency generator, the filter also having a stopband including a second frequency signal (e.g., one or more target frequencies) generated in the main circuit.

In some implementations, the sensor 333 includes at least a frequency generator, a resistor, and a filter. As an example, the frequency generator, the resistor, and the filter can be arranged in the sensor 333 such that a capacitance measurement can be made by the sensor 333 using the voltage measurement method.

Figure 5:
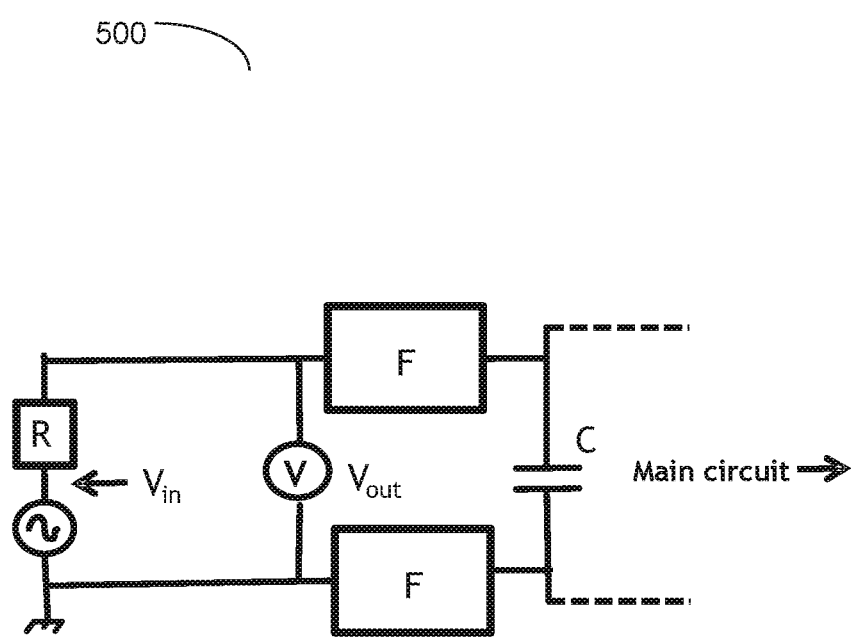
FIG. 5 shows an example capacitance sensor using a voltage measurement method.

An example of an implementation of the sensor 333 configured to measure the capacitance of a capacitor using the voltage measurement method without requiring that the capacitor be disconnected from a high power RF output is shown as sensor 500 on FIG. 5. As illustrated, the capacitor to be measured, C, is coupled to a main circuit denoted by the dashed lines, such as, but not limited to circuitry in RF power source 301, distribution network 321, and/or fixed match module 303. The capacitor C is also coupled to a frequency generator Vin through a series resistor R and one or more filters F. The sensor 500 can include an interface for coupling to a voltage measurement device V for measuring Vout, the voltage at the terminals of the capacitor C through the filter. The voltage measurement device may be implemented with any one of a variety of architectures as known in the art. The voltage measurement device may be integrated with the sensor 500, or may interface with the sensor 500 through input/output ports.

In certain implementations, the frequency generator Vin in the sensor 500 can correspond to a known frequency, such as a frequency that is greater than about 10 times the frequency in the main circuit, including but not limited to circuitry in RF power source 301, distribution network 321, and/or fixed match module 303. As one example, the RF power source 301 can have a frequency of 13.56 MHz, and the frequency generator can have a frequency of 150 MHz. The one or more filters F are configured to include the frequency generated by the frequency generator in a passband, and to include frequencies generated by the main circuit in a stop band. For example, the filter can be a VHF band pass filter with a center frequency of 150 MHz such that the output of the frequency generator is passed to the capacitor C without significant attenuation, and the filter can have rolloff characteristics such that frequencies at least around 13.56 MHz are significantly attenuated. Continuing the example, because the 13.56 MHz frequency and other frequencies from the main circuit are attenuated by the filter, the alternating current (AC) voltage measured on capacitor C by the voltage measurement device is primarily determined based on the 150 MHz frequency generated by the frequency generator in the sensor 500.

Based on the relationship between the measured AC voltage at Vout and the known or calculated AC voltage Vin of the frequency generator in the sensor 500, the capacitance of C can be determined without disconnecting the capacitor C from the main circuit. For example, the value of the AC voltage Vin of the frequency generator in the sensor 500 corresponds to the current flowing through the combined impedance of the known resistor R (e.g., based on manufacturing specifications, etc.) and the unknown capacitance C, represented by $R+1/j\omega C$, where $\omega$ is the known operational radian frequency of the frequency generator (or f is the known operational hertz frequency of the frequency generator, where $fo=\omega o/2\pi$). The AC voltage Vin is known or can be derived based on the configuration of the frequency generator. The measured AC voltage Vout corresponds to the current flowing through the impedance of the unknown capacitance C (as filtered by the one or more filters F), which is represented by $1/j\omega C$. Using the known Vin and measured Vout, the ratio $Vout/Vin=1/(1+j\omega RC)$ can be used to determine the unknown capacitance C by using the known values of $\omega$ and R.

In some implementations, the sensor 333 includes at least a variable frequency generator, an inductor, and a filter. As an example, the variable frequency generator, the inductor, and the filter can be arranged in the sensor 333 to use the resonant frequency method to measure capacitance.

Figure 6:
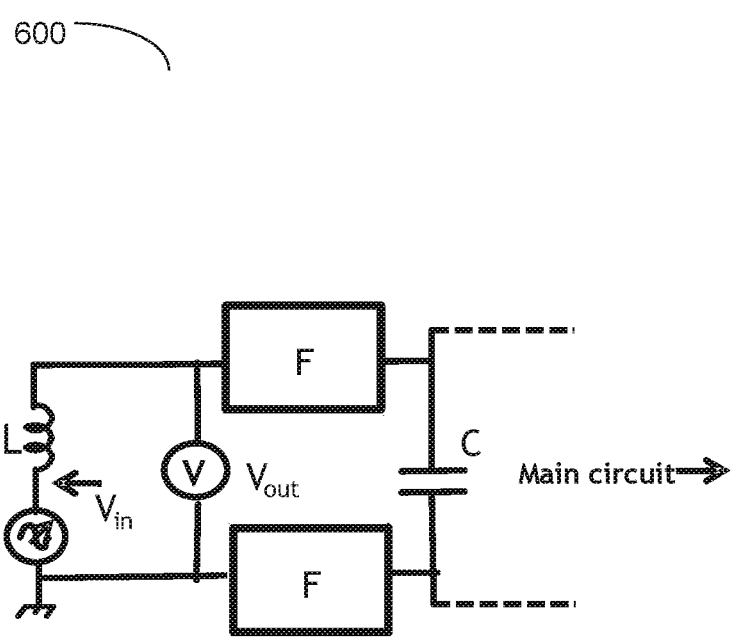
FIG. 6 shows an example capacitance sensor using a resonant frequency method.

An example of an implementation of the sensor 333 for measuring capacitance using the resonant frequency method without requiring that the capacitor be disconnected from a high power RF output is shown on sensor 600 in FIG. 6. As illustrated, the capacitor to be measured, C, is coupled to a main circuit. The capacitor C is also coupled to a variable frequency generator Vin through a series inductor L and one or more filters F.

The sensor 600 can include an interface for coupling to a resonance meter for detecting the resonance frequency at the terminals of the capacitor C through the one or more filters F. The resonance meter may be implemented with any one of a variety of architectures as known in the art. For example, at the resonant frequency, a maximum current flows through the capacitor C, and the resonance meter may be a current meter measuring the current flowing in the circuit. Continuing the example, in a frequency scan performed by sweeping the output of the variable frequency generator across a frequency range, a peak in a current flow vs. frequency plot indicates the resonant frequency. The resonance meter may be integrated with the sensor 600, or may interface with the sensor 600 through input/output ports.

As discussed previously for the voltage measurement method, the variable frequency generator in sensor 600 can correspond to a known frequency band, such as a frequency band that is greater than 10 times the frequency in the main circuit. Similarly to as discussed previously, the one or more filters F are configured to include the frequency generated by the variable frequency generator in a passband, and to include frequencies generated by the main circuit in a stop band. As a result, the resonant frequency detected on capacitor C by the resonance meter is primarily determined based on the signal from the variable frequency generator in the sensor 600.

Based on the relationship between the measured resonant frequency and the known value of the inductor L, the capacitance of C can be determined without disconnecting the capacitor C from the main circuit. For example, the resonant frequency for a series LC circuit corresponds to when the inductive and capacitive reactances are equal in magnitude but are 180 degrees apart in phase, and therefore cancel each other out. Resonance is represented by the equation $fo=\omega o/2\pi=1/2\pi \sqrt{(LC)}$. The hertz frequency corresponding to the minimum in impedance that occurs at resonance can be detected by the resonance meter to determine the value of fo. The unknown value of the capacitance C can then be calculated based on the measured fo and the known value of the inductor L (e.g., manufacturing specification, inductance measurement, etc.).

While the previous examples were in the context of the voltage measurement method or the resonant frequency method, it should be appreciated that for other embodiments of capacitance measurement techniques, including but not limited to a Wheatstone bridge method, a charge based method, a ramp rate method, a timer method, an oscilloscope method to measure a voltage drop across the capacitor, a LCR meter method for directly measuring capacitance, or a vector analyzer method to measure impedance directly and convert to a capacitance value, the capacitor being measured can be coupled to a frequency generator and filter similar to as described above, such that capacitance can be measured without requiring the capacitor being measured to be disconnected and/or high power RF operation to be stopped.

Figure 7:
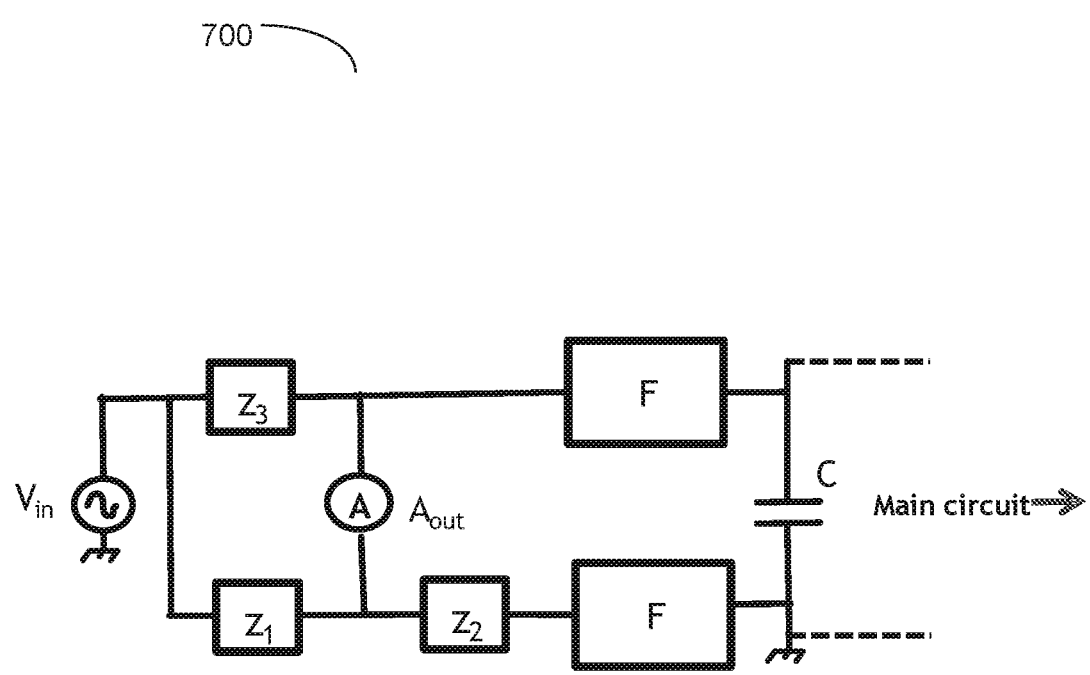
FIG. 7 shows an example capacitance sensor using a Wheatstone bridge method.

An example of an implementation of the sensor 333 for measuring capacitance using the Wheatstone bridge method without requiring that the capacitor be disconnected from a high power RF output is shown on sensor 700 in FIG. 7. In FIG. 7, one terminal of the capacitor is depicted as being grounded, but it should be appreciated that the ground connection can be at, for example, the node between the depicted impedance z2 and the one or more filters F.

Sensor 700 can measure a capacitance by generating an alternating voltage (Vin) at a frequency (w) using an oscillator, where the output of the oscillator is coupled to a first terminal of the capacitor through at least a first impedance (z1) and a second impedance (z2) that are each in series with the capacitor. The output of the oscillator is also coupled to a second terminal of the capacitor through at least a third impedance (z3) that is in series with the capacitor.

Sensor 700 measures a filtered current Aout (or filtered voltage) at a node coupling the first impedance (z1), the second impedance (z2), and the third impedance (z3). The measured filtered signal represents an imbalance between the branches of the Wheatstone bridge. For example, the current Aout in FIG. 7 represents the amount of imbalance between a first impedance combination comprising the first impedance (z1) and the second impedance (z2), and a second impedance combination comprising the third impedance (z3) and an impedance of the capacitor (zC). The amount of imbalance is measured and is proportional to the capacitance. For example, the operation of sensor 700 involves converting the measured filtered signal to the measured capacitance value (C) based in part on a ratio z1/z2=z3/zC, where the impedance (zC) of the capacitor having a capacitance (C) is represented by zC=1/jωC. It should be appreciated that when the Wheatstone bridge is balanced, no current (Aout) flows in the measurement system branch depicted in FIG. 7. It should further be appreciated that one or more of the depicted impedance elements in the Wheatstone bridge can be a variable impedance.

Figure 8:
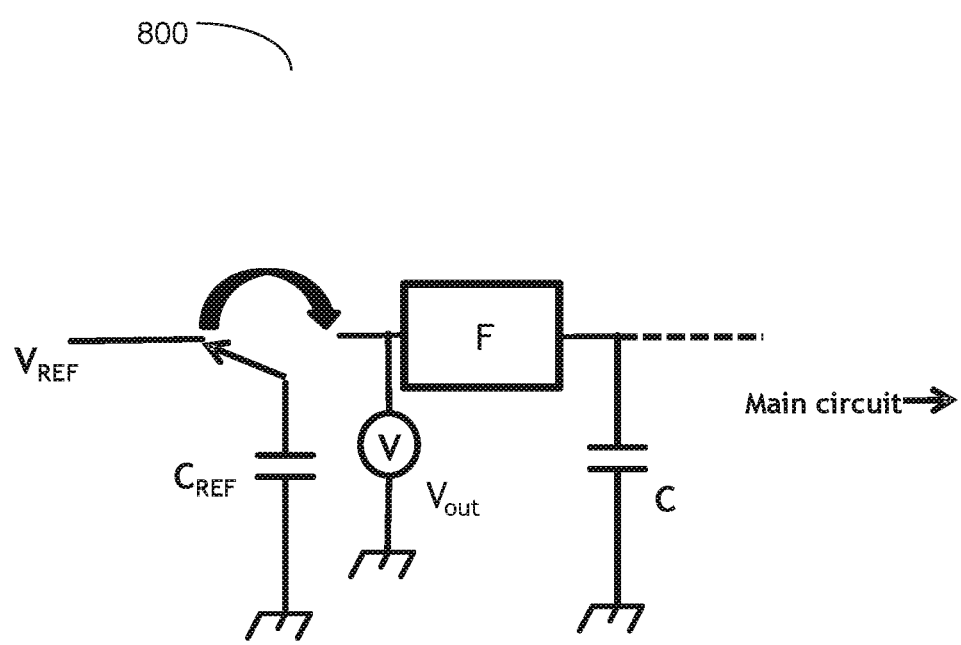
FIG. 8 shows an example capacitance sensor using a charge based method.

An example of an implementation of the sensor 333 for measuring capacitance using the charge based method without requiring that the capacitor be disconnected from a high power RF output is shown on sensor 800 in FIG. 8. In an example implementation, the charge based method relies upon a reference Capacitor (CREF) being changed by a known Voltage Source (VREF) at the first frequency (w). For example, CREF is first charged by VREF and then switched in parallel with the capacitor C being measured. In the scenario where the reference capacitor and the capacitor being measured have the same capacitance value, switching the reference capacitor to be in parallel with the capacitor C results in the total charge in the reference capacitor being distributed equally across the reference capacitor and the capacitor C (i.e., the total charge in the combined system of capacitors remains constant), resulting in a measured voltage Vout filtered by one or more filters F to be a half of the VREF voltage. Knowing the value of CREF and measuring the voltage across the combined C and CREF (VOUT), the value of C can be determined based on C=CREF (VREF/VOUT−1). For example, continuing the previous scenario where the measured voltage is a half of the reference voltage, the ratio (VREF/VOUT−1) between the capacitor C in the reference capacitor CREF is 2−1=1, therefore both capacitors have the same capacitance value, thereby allowing derivation of the measured capacitance C based on the known capacitance for the reference capacitor CREF.

Referring to FIG. 8, operating sensor 800 includes generating an alternating voltage (Vin) as the first signal at the first frequency (w) using an oscillator, where the output of the oscillator is coupled to a reference capacitor (CREF). The reference capacitor is coupled to be electrically parallel with the capacitor when the alternating voltage charges the reference capacitor to a reference voltage (VREF). The sensor 810 measures a voltage signal filtered by the one or more filters F corresponding to a charge in the electrically parallel combination of the reference capacitor and the capacitor at the first frequency (ω), and the sensor 800 or a processor coupled to the sensor 800 converts the measured filtered signal to the measured capacitance value (C) based in part on C=CREF (VREF/Vout−1). In certain implementations, the node between the depicted measurement node of Vout and the capacitor being measured can include at least a first capacitance C1 and a first inductance L1 (not depicted in FIG. 8) that stores circuit energy, such as, for example, parasitic elements, etc., that modify the measured voltage Vout. The effects of L1 and C1 can be accounted for through, for example, calibration or tuning.

Figure 9:
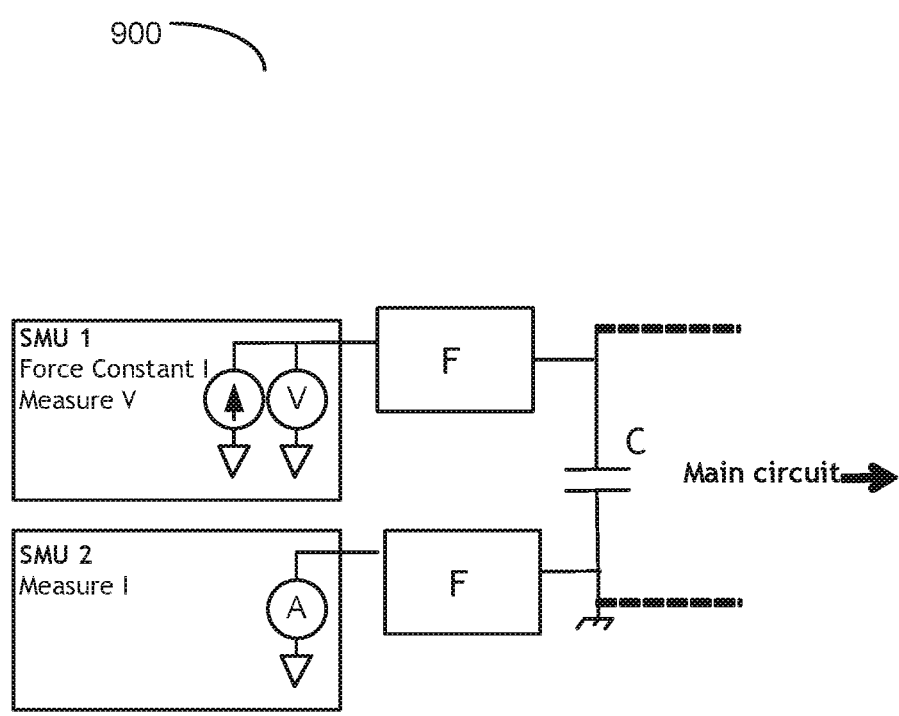
FIG. 9 shows an example capacitance sensor using a ramp rate method.

An example of an implementation of the sensor 333 for measuring capacitance using the ramp rate method without requiring that the capacitor be disconnected from a high power RF output is shown on sensor 900 in FIG. 9. In certain implementations of the ramp rate method, measurements of current and charge are used to calculate capacitance values. In the example of FIG. 9, the ramp rate technique involves at least two source-measure units (SMUs). The first SMU (SMU1 in FIG. 9) forces a constant current at the first frequency (ω) into the device under test (DUT), such as a first terminal of a capacitor in the impedance matching circuit, and measures voltage (V) and time (t) on the node at the output of SMU1, thereby allowing derivation of the rate of change in voltage, dV/dt. Simultaneously, a second SMU (SMU2 in FIG. 9) is measuring the current (A) being output from the DUT's other node, such as the second terminal of the capacitor being measured, as filtered by one or more filters F. The capacitance can then be calculated using the equations I=C dV/dt or C=I/(dV/dt) that relate a measured current at SMU2 to the measured rate of voltage change at SMU1.

Figure 10:
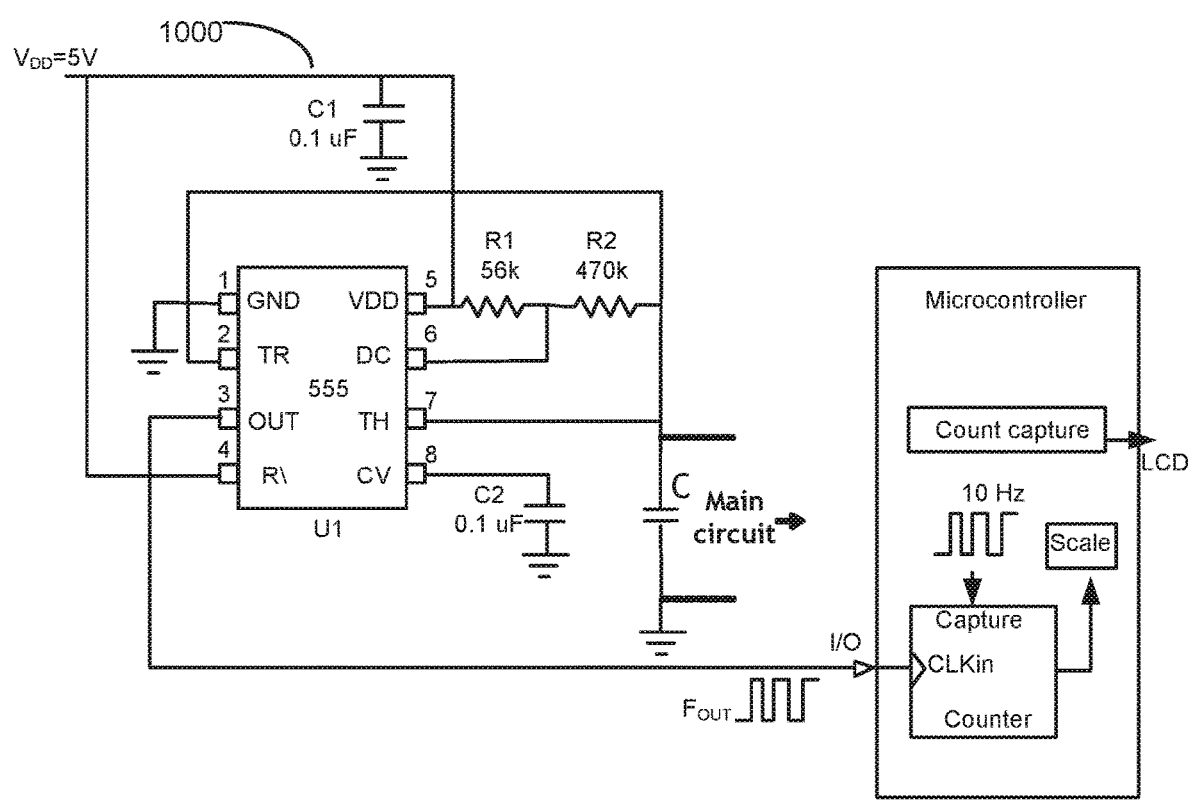
FIG. 10 shows an example capacitance sensor using a timer based method.

An example of an implementation of the sensor 333 for measuring capacitance using the timer method without requiring that the capacitor be disconnected from a high power RF output is shown on sensor 1000 in FIG. 10. In an example implementation of the timer method, an analog timer circuit is used to generate a frequency that is inversely proportional to a capacitance to be measured, and then, for example, a microcontroller is used to count pulses within a given period to calculate the frequency generated by the analog timer circuit. Based on the characteristics of the analog timer circuit, the frequency generated can be used to determine the capacitance C. For example, for a 555 timer circuit, the equation relating the measured capacitor C and frequency F (depicted as Fout in FIG. 10) is F=1/(C*(R1+2*R2)*ln 2), where F is the frequency output of the timer circuit based on the pulse count, R1 and R2 are known resistance values as depicted in FIG. 10. It should be appreciated that timer circuits other than a 555 timer circuit can be used.

The frequency generator in the sensor 333 can be implemented using any one of a variety of architectures as known in the art. In certain implementations, the frequency generator corresponds to a frequency band of VHF (Very high frequency). In certain implementations, the frequency generator corresponds to a frequency generally greater than the 10th harmonic of the operational frequency of other circuitry, including but not limited to main circuitry such as the auto-match circuitry. It should be appreciated that the frequency generator can be fixed or variable frequency. It should further be appreciated that the frequency generator in sensor 333 can correspond to a frequency multiplier for generating a frequency that is a multiple of a reference frequency signal used by other circuitry, such as but not limited to the RF power source 301.

The filter in the sensor 333 can be implemented using any one of a variety of architectures as known in the art. It should be appreciated that the term filter as used herein includes a single filter element or an equivalent filter corresponding to a plurality of filter elements. In various implementations, the filter attenuates frequency signals in the 2-60 MHz range, such as but not limited to 13.56 MHz. In a class of implementations, the filter attenuates frequency signals in the 100 kHz to about 1 MHz range, such as but not limited to 400 kHz. In certain implementations, the filter passes frequency signals in the VHF frequency band. The filter may be a bandpass filter, or may be a high pass filter.

It should be appreciated that the frequency separation of the frequency generator and the frequency of main circuitry is based in part on the characteristics of the filter. For example, if the filter has a high Q value, the frequency generator can be configured to a frequency that is less than the 10$^{th}$ harmonic of the frequency of the main circuitry. As another example, if the filter has a low Q value, the frequency generator can be configured to a frequency that is greater than the 10$^{th}$ harmonic of the frequency of the main circuitry.

It should be noted that the capacitance sensor as disclosed herein is not limited to being within the sensor 333 and is also not limited to measuring capacitance for the RF adjusters 323. It should be appreciated that the capacitance sensor as disclosed herein may be used to measure capacitance for a variety of components in the multi-station plasma reactor described herein, and may also be used to measure capacitance in other apparatuses.

Each station 351 contains a showerhead 353 working in conjunction with a grounded pedestal 357. The power and frequency supplied is sufficient to generate a plasma from the process gas, for example within the range of about 50-6,000 W per station. Power levels may vary according to the implementation. RF power is connected to the station processing area via the showerhead 353 and generates or sustains a plasma when RF power is applied. The plasma causes material to be deposited onto the substrate by a variety of mechanisms. For example, the plasma can cause process gas to break down and react on the substrate surface. In the implementation shown, the RF current is grounded at the pedestals 357, which are connected to the ground 331. In certain other implementations, the RF current may be grounded at a different location in the chamber such as at the showerheads.

The semiconductor tools previously described may be used for plasma balancing. Plasma balancing may be especially beneficial in a multi-cycle deposition process with short cycle durations such as ALD and atomic layer etching (ALE). Atomic layer etching methods are further discussed in the following U.S. patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT."

The plasma activation step of multi-step deposition processes with short cycle durations may be brief. The duration of the plasma activation step may be about 150 milliseconds or less (e.g., about 50 milliseconds). Due to the short durations, control of plasma consistency has an effect on process uniformity. Plasma balancing may be used to control plasma consistency.

Figure 4A:
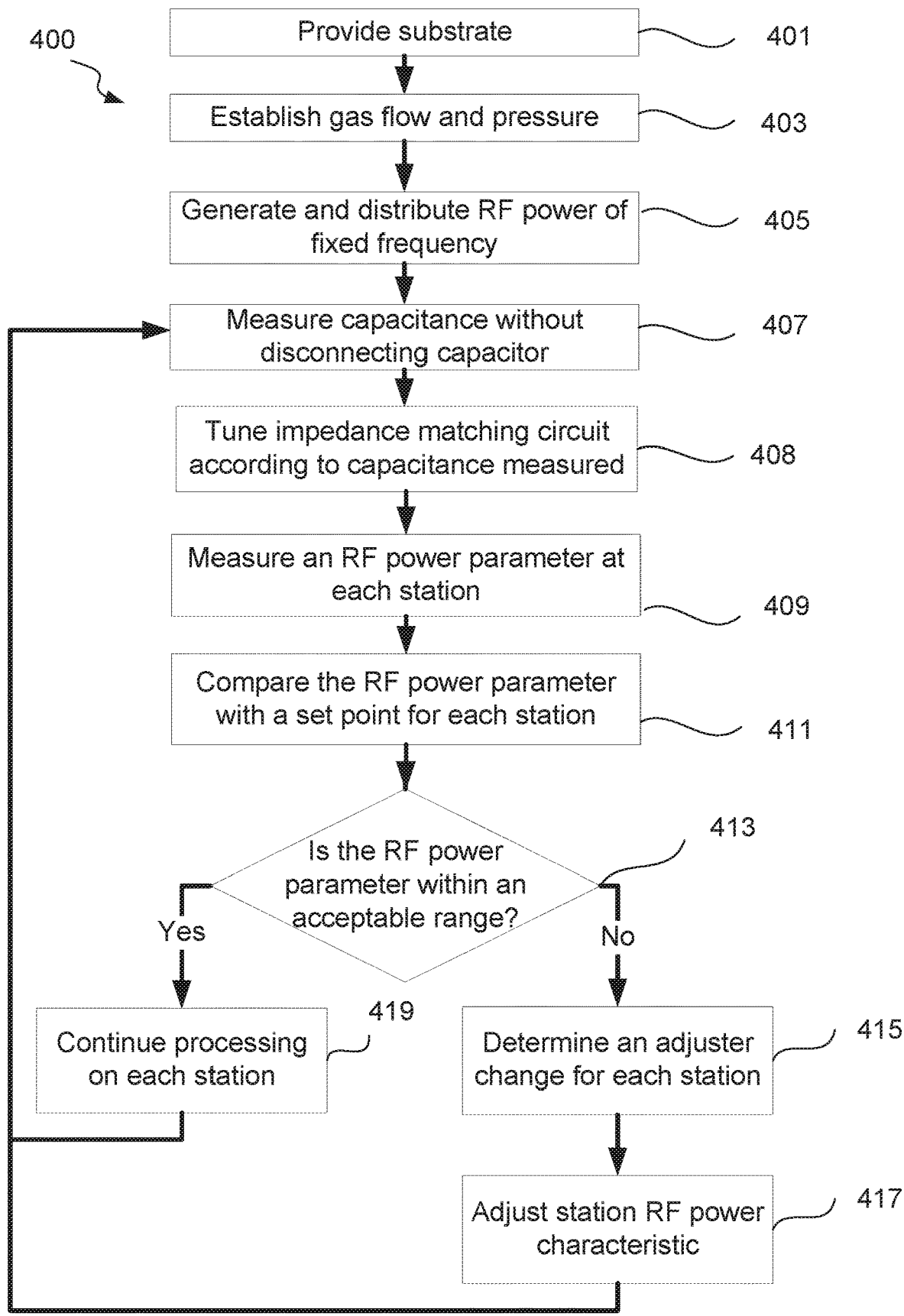
FIG. 4A is a process flow diagram of a multi-station deposition process utilizing impedance matching tuning and RF power parameter adjustment.

FIG. 4A is a process flow diagram of a multi-station deposition process utilizing RF frequency tuning and RF power parameter adjustment. The process described in FIG. 4A may be applicable to a variety of steps in deposition processes, such as step 3 of the ALD cycle which was previously described. Although the process is discussed in the context of a deposition procedure, elements of the process may be applied to any plasma-assisted semiconductor process.

In operation 401, a substrate is provided. Substrates may be provided to one or more stations of a multi-station tool. Substrates may be provided through the loading of a station with a substrate or the substrate may already be in the station due to a previous operation, such as from a previous cycle.

After a substrate is provided, gas flow is established in operation 403 and pressure is stabilized at a set point. Operation 405 starts the generation of RF power. The RF power may be HFRF, LFRF, or both HFRF and LFRF. Before operation 405, the impedance between the electrode, typically the showerhead, and the substrate may be very high, similar to the impedance of an open circuit. In operation 405, the RF power may be generated and applied to ignite the plasma. The RF power may be applied such that the magnitude of the impedance is fixed at a certain resistance, such as a resistance of 50 ohms. The RF power may be applied at a fixed frequency. The fixed frequency may be a pre-determined frequency of RF power. In certain other implementations, the frequency of the RF power generated in operation 405 may not be according to a fixed frequency. In such implementations, the frequency in operation 405 may be varied in a variety of ways, such as through algorithms, user input, feedback from previous operations of the deposition process, etc. In certain implementations, operation 405 may last for a limited duration, such as a period of less than 5 milliseconds.

After the plasma has been ignited properly, the process may continue to operation 407. Full power may be delivered from operation 407 onward. Operations 407-19 are repeated for the remaining duration of the step of the deposition process. Hence, if the process of FIG. 4A is used in step 3 of the ALD cycle, operations 407-19 are repeated until the end of step 3. In operation 407, a capacitance of a variable capacitor in an impedance matching circuit may be measured. During the process described in FIG. 4A, chemical reactions and changes in the environmental conditions within the processing station may lead to changes in the impedance of the plasma, therefore monitoring and adjusting the capacitances in the impedance matching circuit can facilitate matching the impedance of the plasma with the impedance of the RF power source (e.g., 50 Ohms). The capacitance of a variable capacitor in the impedance matching circuit may be measured by the sensors described elsewhere in this disclosure herein.

In operation 408, the impedance matching circuit may be tuned according to the capacitance measured in step 407. Certain implementations of the semiconductor processing tool may include a controller and associated instructions for tuning impedance matching based on detected capacitances. The instructions may be based on plots, may be according to formulas, or other methods of calculating the required impedance match. For example, the impedance matching may be tuned, in addition to or in place of RF power frequency tuning, such that the phase of the impedance is as close to a zero value as possible. As the impedance changes during semiconductor processing, the impedance matching may be adjusted accordingly in operation 408. In certain implementations, the capacitance may be measured as an average of the capacitance at each station. Other implementations may include the ability to measure the capacitance at each individual station. As previously mentioned, operations 407 and 408 are continuously performed until the end of the deposition process step due to the potential for changes in the impedance.

In operation 409, a RF power parameter may be measured at each station to determine variations among the stations. The RF power parameter may be measured after plasma is generated in the station and reflects the dynamic impedances in each station. This parameter may be a voltage, current, capacitance, impedance, phase, load power, power delivered to the station, or any combination of the previous.

The RF power parameter measurements may be compared with a set point for each station in operation 411. In certain implementations of RF power balancing, the set points may be the same for every cycle of the deposition process. In other implementations, the set points may vary between cycles of the deposition process. For example, the set points may be an average of the measured power delivered to each station. In yet other implementations, the set points may be different at each station. This comparison may be performed at a local controller, a central controller for RF adjusters, or at a system control for the entire tool.

The total RF power delivered to the all stations that share a common RF source depends on the power set point at the RF generator, the impedance of the plasma load and the impedance of the RF network. The RF adjusters affect primarily station-to-station power distribution. Adjuster effects on total power are usually secondary. In certain cases, depending on the type of RF adjuster used, a reduction in RF power of one station may increase RF power in other stations. In those cases the controller may determine an adjustment taking station-station RF power interactions into account or simply repeat the adjustment many times until the measurements are within a threshold margin to the set point.

In certain cases an absolute RF power level is desired. In this case, RF power can be measured at each station and then two adjustments executed. For example, first, total power at the generator output is changed to match the sum of station set points. Second, the station RF adjusters are tuned to split power according to the set points. The order of adjustments (total power vs. split) may be reversed. The procedure is repeated until power split is within a threshold margin to the set points.

In operation 413, the measured RF power parameter distribution may be compared with the set point(s). If the difference is higher than a threshold, then an adjuster change at each station may be determined at operation 415. The adjuster change needed may vary station by station. Certain stations may require no adjuster change at all while other stations may require an adjuster change. This adjuster change may be determined by the RF controller or another controller. Note that the parameter or RF characteristic to be adjusted may be different from the RF power parameter measured. In one example, RF power may be measured and capacitance or impedance matching adjusted.

The needed adjuster change may be applied to adjust a station RF characteristic at operation 417. In certain implementations, the station impedance matching may be adjusted by the adjuster change amount in operation 417. The capacitances used for impedance matching may then be measured again starting from operation 407 and the adjustment cycles of the impedance matching may continue until the deposition process has finished.

If the power parameter measured in operation 411 and compared in operation 413 is within an acceptable range, the semiconductor processing continues in operation 419. The process may then continue starting from operation 407 until the deposition process has finished. While the description of certain example implementations in this disclosure are in the context of a deposition process, it should be appreciated that other semiconductor processing operations in addition to or instead of deposition, including but not limited to etching, stripping, or cleaning a thin film from a substrate, are contemplated for the disclosed capacitance measurement techniques. It should further be appreciated that the disclosed capacitance measurement techniques facilitate providing uniform and/or repeatable process conditions (e.g., RF power, etc.) at multiple semiconductor processing stations for semiconductor processing operations (e.g., deposition, etch, strip, clean, etc.), thereby improving the yield of semiconductor fabrication.

In various implementations, the sequence of operations 407-19 may be arranged in different orders. For example, operation 409 (and possibly operations 409-19) may be performed before operation 407. In other implementations, operations 407-08 may be performed concurrently with operations 409-19. In yet other implementations, the measurement operations 407 and 409 may be performed before the tuning and adjustment operations 408 and 411-19.

In the power balancing context, continuous RF power control during processing may be needed for at least two reasons. One possibility is following an intentional RF power curve. The set points may vary over time during a processing sequence. The RF adjusters may be used to maintain specific power distribution as set points vary. In another possibility, the station RF power may have tendency to drift during processing and needs to be adjusted based on dynamic feedback.

In certain implementations, a semiconductor processing operation may include multiple different deposition processes in a single multistation reactor. The multiple different deposition processes may deposit different materials, particularly layers of material such as a barrier layer or a nucleation layer in contact with an underlying substrate, a bulk layer on top of the nucleation layer, a capping layer on top of the bulk layer, etc. These individual layers may have relatively similar (or different) compositions. In some cases, the different deposition processes may use different process gases. When a semiconductor processing operation has multiple different deposition processes, different recipes are typically used for the different deposition processes. In such cases, different RF power parameter set points for individual stations may be used for the different recipes. In certain implementations, the differences in the set points would result in variations between the initial adjuster setting for the different recipes. Such initial adjuster settings may be contained in or a part of the recipes for the deposition processes. The different recipes of the different deposition processes may reflect the variations in the initial adjuster settings of the different processes. In such cases, the initial adjuster settings for the separate processes may be determined through prior simulation or testing results. In certain implementations, the RF power frequency that is first generated and distributed to the stations may be at different per-station power settings for the individual recipes. In such implementations, the RF adjusters may be further tuned during the deposition process according to the techniques described herein. In certain embodiments, the initial adjuster position may be an adjuster position that is calculated to result in the least amount of RF adjuster tuning when the deposition process is performed over multiple cycles.

Figure 4B:
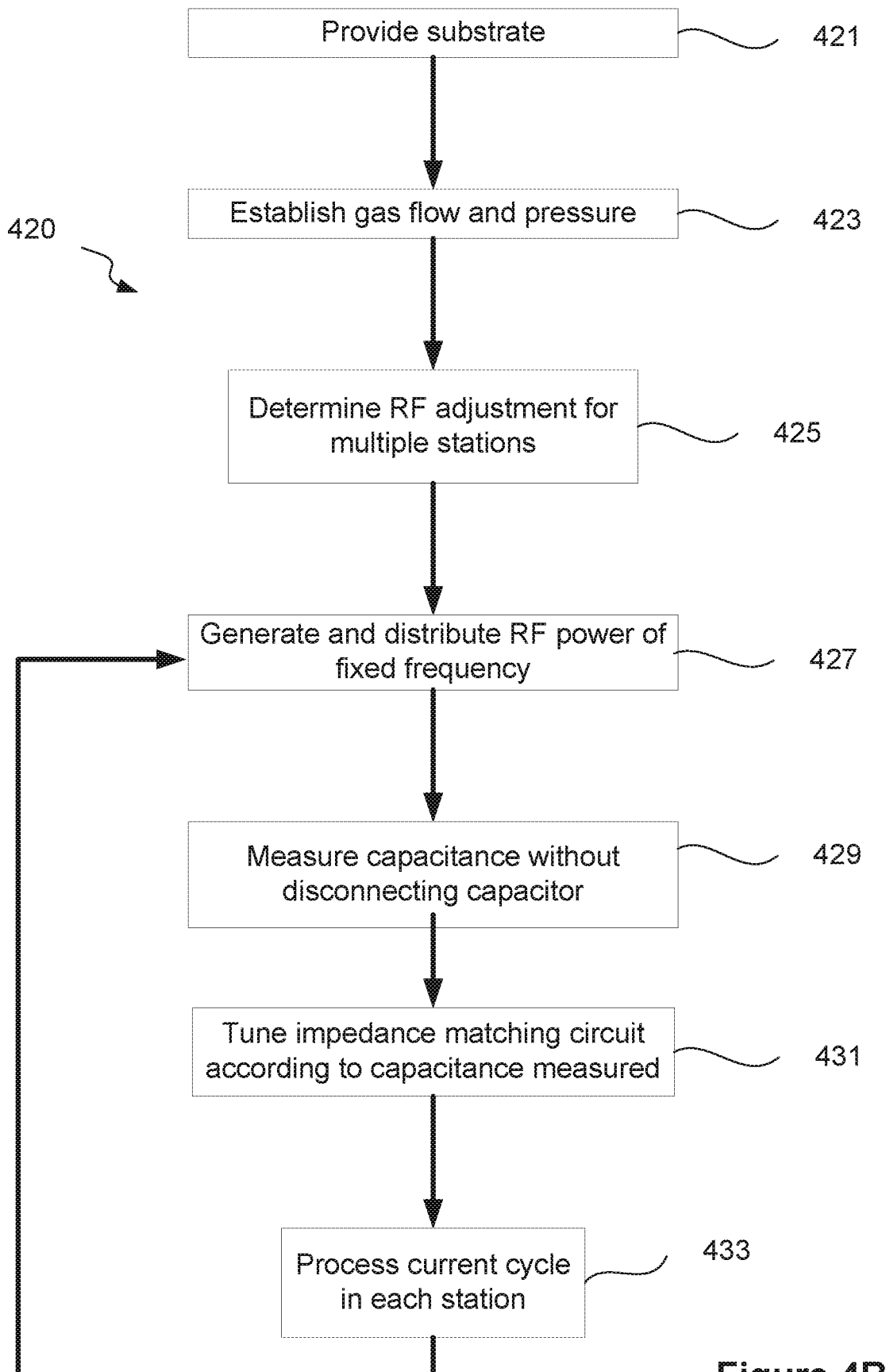
FIG. 4B is a process flow diagram of a multi-station deposition process utilizing impedance matching tuning.

FIG. 4B is a process flow diagram of a multi-station deposition process utilizing impedance matching tuning. FIG. 4B is similar to FIG. 4A, however while FIG. 4A describes a process utilizing both impedance matching tuning and RF power parameter adjustment during the deposition process, FIG. 4B describes a process utilizing only impedance matching tuning during the deposition process.

Process flow diagram of FIG. 4B may be a process utilized for a deposition process utilizing Impedance matching tuning. Certain implementations may use the process illustrated in Process 4B for an individual deposition process of a semiconductor processing operation that includes multiple different deposition processes. The multiple different deposition processes may deposit different materials as described herein. In other embodiments, only a single deposition process is used. Either way, the station-to-station RF power adjustment is fixed and may be set prior to the deposition process. Typically, the process does not employ feedback of an RF power parameter to determine appropriate RF power adjustment during deposition.

In process flow diagram 420 of FIG. 4B, operations 421 and 423 are similar to operations 401 and 403 of FIG. 4A, respectively. In operation 425 of FIG. 4B, RF adjustments for the multiple stations are determined. The RF adjustments for the multiple stations are determined prior to generation of RF power and the processing of the substrates. The RF adjustments may be determined via historical data, calculations, or trial and error.

After the RF adjustment has been performed in operation 425, the process may proceed to operation 427. Operations 427, 429, and 431 are similar to operations 405, 407, and 408 of FIG. 4A, respectively. In operation 433, the current cycle is processed for each station and the process is then repeated for the desired number of cycles. During each of the desired number of cycles, operations 427, 429 and 431 are repeated so that the impedance matching is continuously tuned according to the requirements of the impedance measured. The impedance matching and/or RF power frequency may be tuned according to the techniques described elsewhere in this disclosure herein.

Various other configurations and apparatus for power balancing for multi-station semiconductor processing apparatuses are described in U.S. Pat. No. 8,282,983, issued Oct. 9, 2012, which is incorporated herein by reference in its entirety for this purpose.

What is claimed is:

1. A method of plasma-assisted semiconductor processing in multiple stations in a process chamber, the method comprising:
   a) providing substrates at each of the multiple stations;
   b) distributing RF power including a first target frequency to multiple stations to thereby generate a plasma in the stations, wherein the RF power is distributed according to a RF power parameter configured to reduce station to station variations;
   c) tuning an impedance matching circuit for a first station included in the multiple stations while distributing RF power to the first station by:
      i) measuring a capacitance of a capacitor in the impedance matching circuit without disconnecting the capacitor from the impedance matching circuit; and
      ii) adjusting, according to the capacitance measured in (i) and the RF power parameter, a capacitance of the capacitor; and
   d) performing a semiconductor processing operation on the substrate at each station.

2. The method of claim 1, wherein the semiconductor processing operation is one of: depositing, etching, stripping, or cleaning a thin film.

3. The method of claim 2, wherein i) comprises:
   aa) generating a first signal including a first frequency above the first target frequency in the RF power being distributed;
   bb) filtering a signal at the capacitor, the signal at the capacitor being generated in response to at least the first signal and the RF power being distributed;
   cc) measuring the filtered signal; and
   dd) converting the measured filtered signal to a measured capacitance value for the capacitor.

4. The method of claim 3, wherein the filtering includes a passband centered at greater than a 10th harmonic frequency of the first target frequency, and the filtering includes a stopband including the first target frequency in the RF power being distributed.

5. The method of claim 4, wherein the first target frequency in the RF power being distributed is about 13.56, 27, 40, 60, or 100 MHz.

6. The method of claim 4, wherein the first target frequency in the RF power being distributed is about 400 kHz.

7. The method of claim 3, wherein:
   aa) includes generating an alternating voltage (Vin) as the first signal using a fixed frequency oscillator configured at the first frequency (w), an output of the fixed frequency oscillator being coupled to a resistance (R) that is in series with the capacitor; and
   dd) includes converting the measured filtered signal (Vout) to the measured capacitance value (C) based in part on the resistance (R), the first frequency (w), and the alternating voltage (Vin), where Vout/Vin=1/(1+jωRC).

8. The method of claim 3, wherein:
   aa) includes generating an alternating voltage (Vin) as the first signal using a variable frequency oscillator, an output of the variable frequency oscillator being coupled to an inductance (L) that is in series with the capacitor, the variable frequency oscillator being configured to scan a frequency range including a resonant frequency (fo=ωo/2π) of the capacitor and the inductance;
   cc) includes using the measured filtered signal to determine the resonant frequency; and
   dd) includes converting the measured filtered signal to the measured capacitance value (C) based in part on the resonant frequency (fo=ωo/2π) and the inductance (L), where fo=ωo/2π=1/2π sqrt(LC).

9. The method of claim 3, wherein:
   aa) includes generating an alternating voltage (Vin) as the first signal at the first frequency (ω) using an oscillator, an output of the oscillator being coupled to a first terminal of the capacitor through at least a first impedance (z1) and a second impedance (z2) that are each in series with the capacitor, the output of the oscillator also being coupled to a second terminal of the capacitor through at least a third impedance (z3) that is in series with the capacitor;
   cc) includes measuring as the measured filtered signal a current or voltage at a node coupling the first impedance (z1), the second impedance (z2), and the third impedance (z3), wherein the measured filtered signal represents an imbalance between:
      a first impedance combination comprising the first impedance (z1) and the second impedance (z2), and a second impedance combination comprising the third impedance (z3) and an impedance of the capacitor (zC); and
   dd) includes converting the measured filtered signal to the measured capacitance value (C) based in part on a ratio z1/z2=z3/zC, where zC=1/jωC.

10. The method of claim 3, wherein:
    aa) includes generating an alternating voltage (Vin) as the first signal at the first frequency (ω) using an oscillator, an output of the oscillator being coupled to a reference capacitor (Cref), and connecting the reference capacitor to be electrically parallel with the capacitor when the alternating voltage charges the reference capacitor to a reference voltage (Vref);

cc) includes measuring as the measured filtered signal a voltage corresponding to a charge in the electrically parallel combination of the reference capacitor and the capacitor at the first frequency ($\omega$); and dd) includes converting the measured filtered signal to the measured capacitance value (C) based in part on C=Cref (Vref/Vout−1).

11. The method of claim 3, wherein:

aa) includes generating an alternating current (Iin) as the first signal at the first frequency ($\omega$) at a first terminal of the capacitor using a current source, an output of the current source being coupled to a voltage measurement interface for measuring a voltage (V);

cc) includes measuring as the measured filtered signal a filtered current (I) corresponding to a current at a second terminal of the capacitor; and dd) includes converting the measured filtered signal to the measured capacitance value (C) based in part on the filtered current (I) and a rate of change of the measured voltage at the voltage measurement interface (dV/dt), where I=C dV/dt.

12. The method of claim 11, wherein:

aa) includes generating a timer signal using a timer circuit where a timer frequency (f) is configured using a first resistance (R1), a second resistance (R2), and the capacitance (C) of the capacitor;

cc) includes measuring as the measured filtered signal a timer pulse count within a time period for determining the timer frequency (f); and dd) includes converting the measured filtered signal to the measured capacitance value (C) based in part on the determined timer frequency, where f=1/(C×(R1+2× R2)×ln2).

13. The method of claim 3, wherein an oscilloscope is used to measure a voltage drop across the capacitor at the first frequency ($\omega$).

14. The method of claim 3, wherein an inductance (L), capacitance (C), and resistance (R) meter (LCR meter) is used to measure the capacitance of the capacitor at the first frequency ($\omega$), or a vector network analyzer is used to measure an impedance of the capacitor at the first frequency ($\omega$).

15. An apparatus for plasma-assisted semiconductor processing, the apparatus comprising:

multiple stations, wherein each of the stations includes at least one wafer support and is configured to receive at least one substrate, and wherein the multiple stations are within a process chamber;

a capacitance sensor;

one or more controllers, wherein the one or more controllers and the capacitance sensor are communicatively connected and the controller is configured to:

a) provide substrates at each of the multiple stations;

b) distribute RF power including a first target frequency to multiple stations to thereby generate a plasma in the stations, wherein the RF power is distributed according to a RF power parameter configured to reduce station to station variations;

c) tune an impedance matching circuit for a first station included in the multiple stations while distribute RF power to the first station by:

i) measure, using the capacitance sensor, a capacitance of a capacitor in the impedance matching circuit without disconnecting the capacitor from the impedance matching circuit; and ii) adjust, according to the capacitance measured in (i) and the RF power parameter, a capacitance of the capacitor; and d) performing a semiconductor processing operation on the substrate at each station.

16. The apparatus of claim 15, wherein i) comprises:

aa) generate a first signal including a first frequency above the first target frequency in the RF power being distributed;

bb) filter a signal at the capacitor, the signal at the capacitor being generated in response to at least the first signal and the RF power being distributed;

cc) measure the filtered signal; and dd) convert the measured filtered signal to a measured capacitance value for the capacitor.

17. The apparatus of claim 16, wherein the filter includes a passband centered at greater than a 10th harmonic frequency of the first target frequency, and the filter includes a stopband including the first target frequency in the RF power being distributed.

18. The apparatus of claim 16, wherein an oscilloscope is used to measure a voltage drop across the capacitor at the first frequency ($\omega$).

19. The apparatus of claim 16, wherein an inductance (L), capacitance (C), and resistance (R) meter (LCR meter) is used to measure the capacitance of the capacitor at the first frequency ($\omega$), or a vector network analyzer is used to measure an impedance of the capacitor at the first frequency ($\omega$).

20. A device for measuring a capacitance of a capacitor without disconnecting the capacitor from a circuit for distributing RF power at a first target frequency, the device comprising:

a filter including a passband including a first frequency greater than a 10th harmonic frequency of the first target frequency, the filter also having a stopband including the first target frequency;

an oscillator for generating an alternating voltage (Vin) at the first frequency ($\omega$);

a resistance (R), wherein an output of the oscillator is coupled to a first terminal of the resistance (R), and a second terminal of the resistance (R) is coupled to the filter that is electrically coupled in series with the capacitor; and a voltage measurement interface for measuring a filtered signal (Vout) at the second terminal of the resistance (R), wherein a measured capacitance value (C) of the capacitor is based in part on the resistance (R), the first frequency ($\omega$), and the alternating voltage (Vin), where Vout/Vin=1/(1+j$\omega$RC).

* * * * *